United States Patent [19]

Anne

[11] Patent Number: 4,527,318
[45] Date of Patent: Jul. 9, 1985

[54] PROCESS AND DEVICE FOR PLACING ELECTRONIC COMPONENTS IN A CASE

[75] Inventor: Jean Anne, Bagnolet, France

[73] Assignee: LCC.CICE-Compagnie Europeenne de Composants Electroniques, Bagnolet, France

[21] Appl. No.: 453,907

[22] Filed: Dec. 28, 1982

[30] Foreign Application Priority Data

Dec. 31, 1981 [FR] France .................. 81 24586

[51] Int. Cl.³ .............................. H01G 7/00
[52] U.S. Cl. .................. 29/25.42; 53/473; 361/306
[58] Field of Search .......... 53/473; 29/25.41, 25.42; 361/306

[56] References Cited

U.S. PATENT DOCUMENTS

| 3,086,149 | 4/1963 | Baron | 361/306 |
|---|---|---|---|
| 3,117,297 | 1/1964 | De Gier | 361/306 |
| 3,394,441 | 7/1968 | Weiss | 29/25.42 |
| 3,411,193 | 11/1968 | Takacs | 361/306 |
| 4,268,942 | 5/1981 | Meal et al. | |
| 4,333,213 | 6/1982 | Meal et al. | 29/25.42 |
| 4,341,013 | 7/1982 | Haidinger | 29/25.42 |

FOREIGN PATENT DOCUMENTS

| 920673 | 2/1973 | Canada | 361/306 |
|---|---|---|---|
| 842377 | 6/1957 | France | |
| 311395 | 1/1956 | Switzerland | 361/306 |
| 833229 | 4/1968 | United Kingdom | |

Primary Examiner—W. D. Bray
Attorney, Agent, or Firm—Oblon, Fisher, Spivak, McClelland & Maier

[57] ABSTRACT

The present invention relates to a process for placing components in a case and to an appropriate device. According to the invention, the component is guided into the case by means of a clamp, whose jaws have an internal impression having substantially the external dimension of the case and which are provided with a chamfer permitting the guidance of the component into the case. Preferably, these jaws also have a second opening provided with a chamfer, by which the case is introduced. During the introduction of the component into the case, the latter is secured in position. Application to the placing in cases of capacitors.

10 Claims, 7 Drawing Figures

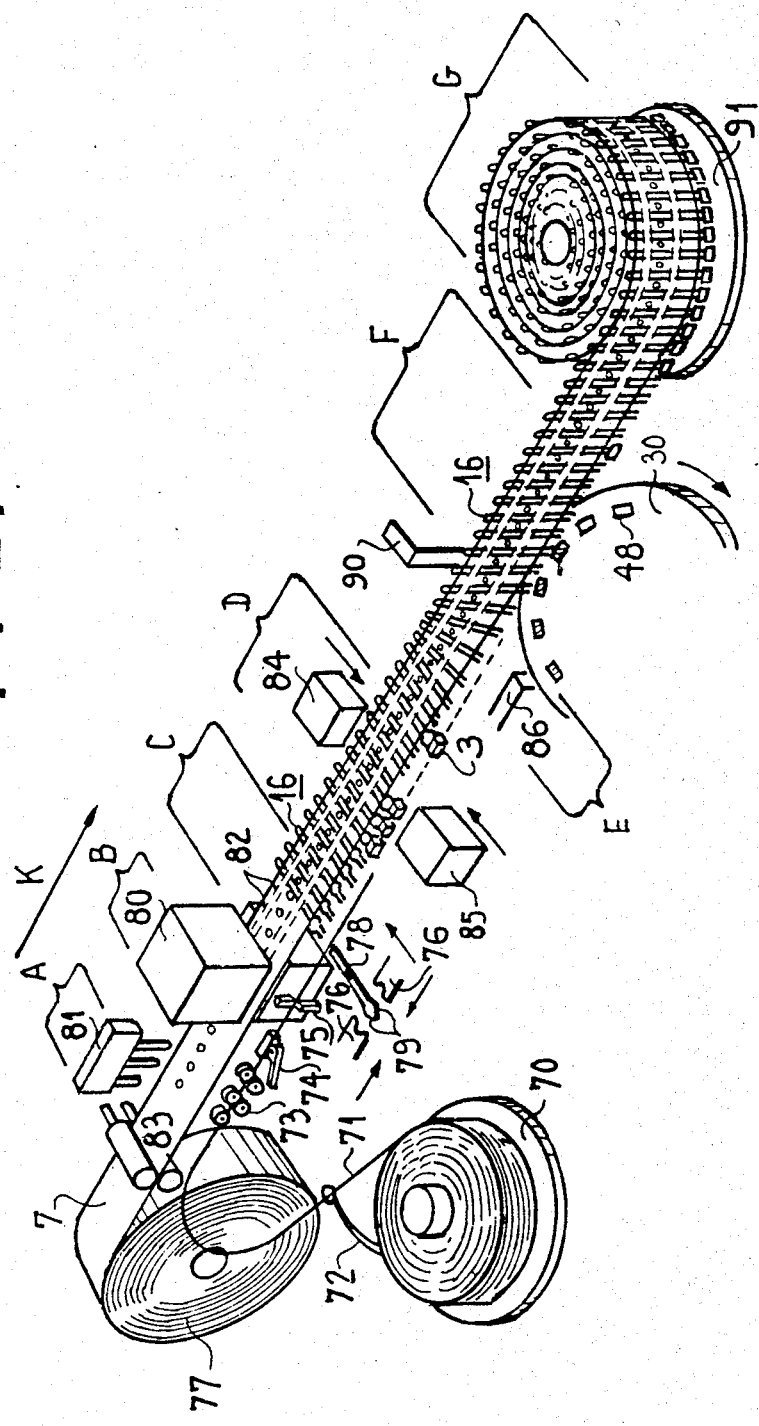
Fig_1

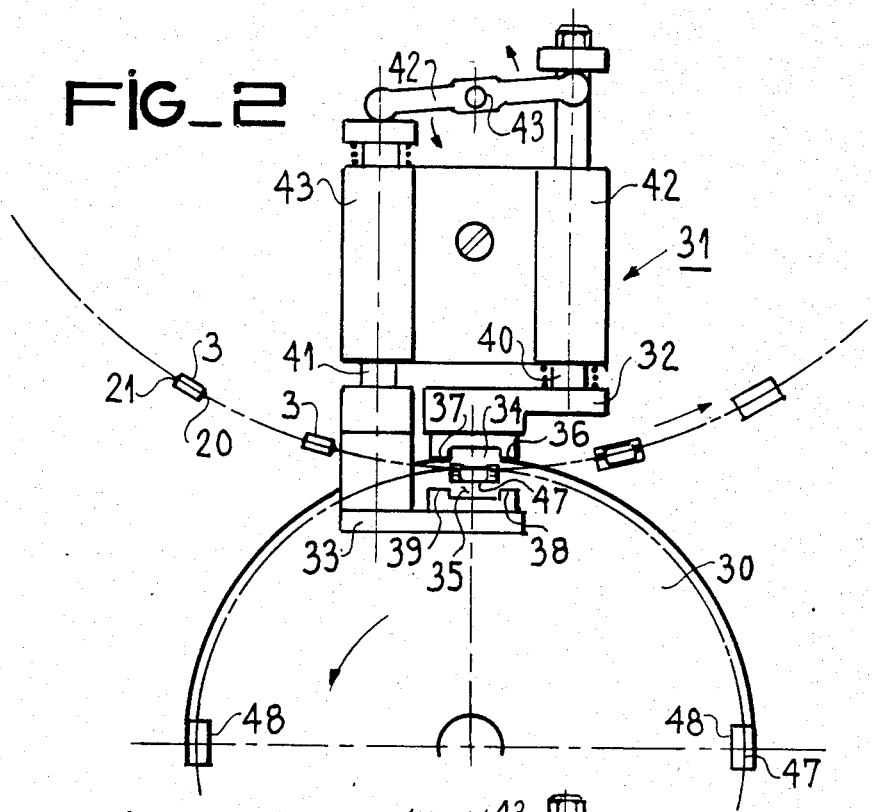
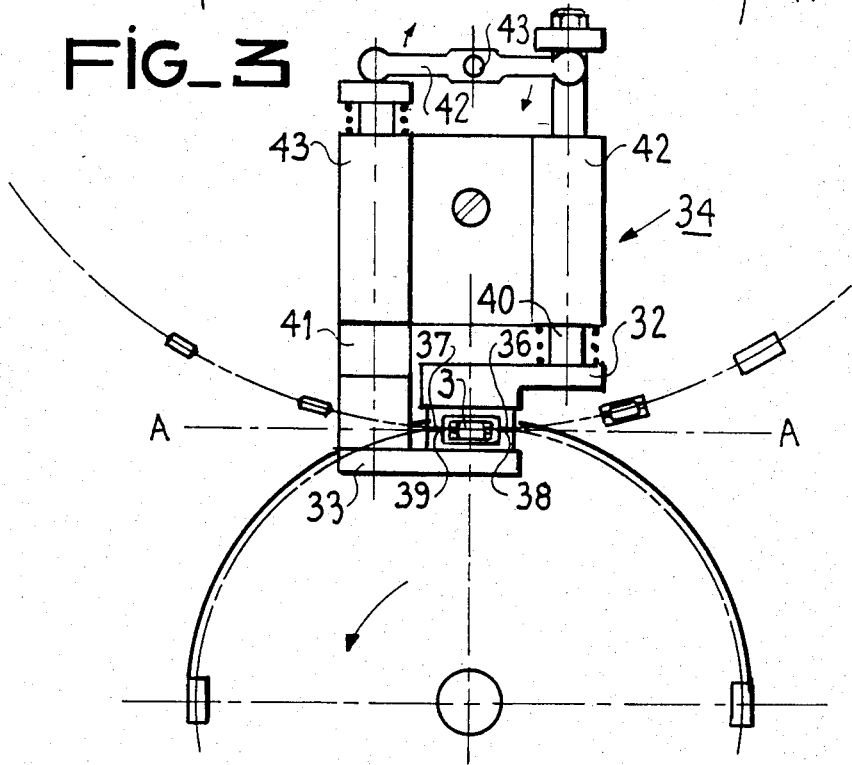

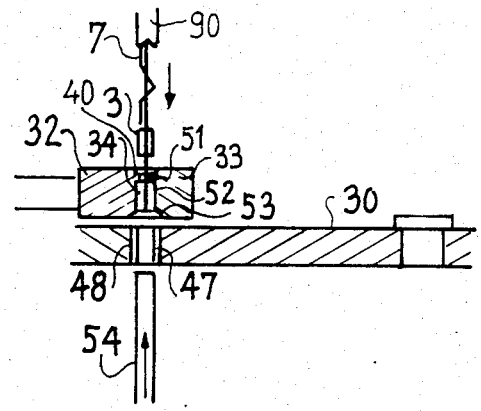
FIG_4
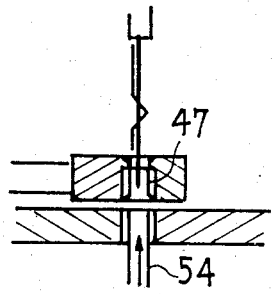
FIG_5
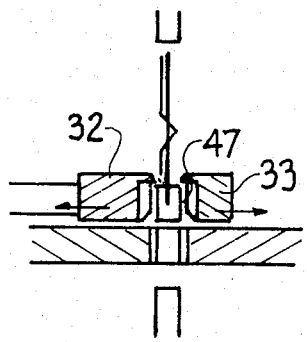
FIG_6
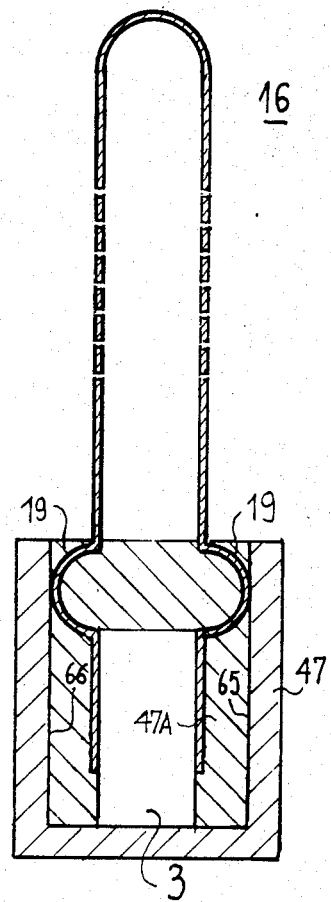
FIG_7

PROCESS AND DEVICE FOR PLACING ELECTRONIC COMPONENTS IN A CASE

BACKGROUND OF THE INVENTION

The present invention relates to a device for placing in a case electronic components located on a belt, incorporating means for the stepwise advance of the belt on which are arranged the electrical connections of the components placed at one end thereof, means for the stepwise advance of a moving support carrying the cases, as well as means for translating the component to the belt in order to bring said component into the case.

The invention also relates to a process for placing electronic components in a case.

In the field of capacitors, to which the invention more particularly relates, components are produced which are generally sold without an enclosing case. Thus, these capacitors have an adequate mechanical strength to protect them. However, certain small or very fragile capacitors, such as metallized plastic film capacitors made by the successive stacking of metallized films, require an external protection in order to improve their resistance to shocks and give them a better external appearance. Generally, the placing in a case of electronic components like capacitors consists of introducing the component into a case filled with hard-enable liquid resin. The case and its component are supported by a support until the resin has hardened or set, which then makes it possible to handle the assembly by means of the clips on the component.

In order to perform this encasing operation, the case is generally positioned with its open face upwards and then the component is vertically translated into the case, parallel to the length of its clips. This translation operation takes place by means of the said clips, so that it is absolutely necessary for the latter to be perfectly rectilinear in order that the introduction operation can take place under satisfactory conditions. However, it is often the case that these clips do not have rectilinear characteristics and production either takes place inadequately or not at all, which leads to a large amount of waste in the production line.

BRIEF SUMMARY OF THE INVENTION

This problem is obviated by the device according to the invention which includes a clamp constituted by two jaws which, in contact with one another, have an internal impression essentially conforming to the external size of the case, said case having at least one opening for the introduction of the component directed towards the case, the closing of the jaws, thereby securing of the case during the introduction of the component, whilst the opening of the jaws makes it possible for the belt and/or moving support to advance.

Thus, the invention is based on the fact that an intermediate funnel-shaped member is placed between the component and the case, the side walls of the said member making it possible to guide the component up to the case, even if the alignment of case and components was not initially correct. The case can thus be brought by any appropriate means between the clamp jaws. For example, for this purpose the case can be supplied by horizontal translation between the open jaws, the latter closing onto the case prior to the introduction of the component. Preferably, the jaws will also have a second opening permitting the introduction of the case on the basis of the same guidance process as for the component. These openings in the jaws make it possible on the one hand to introduce the component and on the other hand introduce the case and are preferably disposed on the two opposite faces of the clamp. The funnel shape given to each of the openings is brought about by inlet chamfers on the said openings.

According to another feature of the invention, the cases are located in a moving table, each case being successively brought to the right of the component to be encapsulated, the case then being extracted from its recess and moved into the clamp by means of a piston or plunger maintained beneath the case during the introduction of the component and which is then removed when encapsulation is ended. The opening in the clamp jaws then make it possible to advance by one step the belt and the moving plate for a further encapsulated operation.

BRIEF DESCRIPTION OF THE DRAWINGS

The invention is described in greater detail hereinafter relative to non-limitative embodiments and the attached drawings, wherein show:

FIG. 1 an overall view of a production line for placing electronic components in a case according to the invention.

FIG. 2 a diagrammatic view of the device according to the invention in which the clamp jaws are open.

FIG. 3 an identical view of that of FIG. 2 in which the clamp jaws are closed.

FIGS. 4 to 6 sectional views of the various encapsulation stages of the component.

FIG. 7 a sectional view of a component after encapsulation in a case by means of the device according to the invention.

DETAILED DESCRIPTION OF THE PREFERRED EMBODIMENTS

FIG. 1 diagrammatically shows a production line for electronic components according to the invention. A cardboard belt 7 of an appropriate width is unwound from a reel 77 and is then perforated by means of perforating station A, so as to form the perforations 83 for the regular advance of the belt. The latter then passes into perforation station B, which cuts appropriate slots 82 for the subsequent fitting of the pin-like connections. It should be noted that these two stages of the process are generally performed beforehand, the strip generally being supplied completely perforated by the manufacturer. The connecting pins are then fitted in the desired form during stage C of the process. For this purpose, a coil 70 of wire 71 is unwound and guided through guides 72, 73, 74. The wire is then guided by means of tool 78 through slots 82 of the perforated belt 7. Wire 71 then assumes the form of tool 78, provided with two convex portions 79. This wire is then engaged with tools 78 by means of press 76, which makes it possible to form the pins 16, following the cutting of the wire by means of cutting tools 75. Belt 7 advances in stepwise manner by means of perforations such as 83. With the pin-like connection 16 formed and placed on perforated belt 7, they then move, to stage D of the process, in the direction of the station 84, 85 for the welding of component 3 to the pin-shaped connection 16. Pin 16 and the belt, which have up to now been horizontal, are then rotated by 90° so as to bring the pins and the component welded to its end into a vertical plane, the component then being located towards the bottom of belt 7. Simultaneously, a rotary table 30 provided with recesses 48 moves in front of the components. Prior to being moved beneath the components, recesses 48 are provided with a case 47, filled with liquid resin 47A by station 86. When a component is located above a case 47 filled with liquid resin, arm 90 lowers the latter by means of pin 16 and the component is housed in the case. Arm 90 is then raised to return pin 16 to the same level as the other pins, the latter now having a case at its end. Belt 7 and rotary table 30 then advance by one step and the process recommences. This stage of inserting the component into the case constitutes stage F of the process. The component provided with its case is then wound onto mandrel 91 in stage G of the process. In FIG. 1, the direction of advance of belt 7 and the components is represented by arrow K.

FIG. 2 shows a diagrammatic plan view of the encasing device according to the invention and which corresponds to stage F of the process of FIG. 1. Belt 7 carrying capacitors 3 follows a substantially circular trajectory in this drawing. Belt 7 is advanced in a stepwise manner by means of the perforations 83 shown in FIG. 1. When a capacitor 3 is placed in a case 47, another capacitor is brought into the encapsulation position, as will be shown hereinafter. Cases 47 are housed in recesses 48 positioned on a rotary table 30. Table 30 has four recesses 48 speed at 90° to one another on its periphery. In the present embodiment, table 30 performs a rotary movement in the opposite direction to that of belt 7. The device according to the invention is indicated by reference 31. It essentially comprises a clamp formed by two jaws 32, 33. Each of these jaws has an internal recesses or impression 34, 35, which are identical in this embodiment and shaped like a half-case 47 in cross-section. Thus, in this case, impressions 34, 35 are half-rectangles in cross-section. The planar ends 36, 37 of jaw 32 face the planar ends 38, 39 of jaw 33. These ends respectively cooperate in pairs, as will be shown relative to FIG. 3. End 37 bears on end 39, whilst end 36 bears on end 38. Each of the jaws 32, 33 is connected to an arm 40, 41, permitting its displacement in the vertical direction of the drawing, by sliding in a sleeve 42, 43. Each of these arms is moved by a single rocking lever 42, which rotates about spindle 43. In FIG. 2, the jaws 32, 33 of the clamp are open, the rocking lever being rotated in the direction of the arrows in the drawing. In this position of jaws 32, 33, a capacitor 3 provided with its lateral connections 20, 21 and fixed to belt 7, can easily be introduced between the same, substantially above a case 47. The remainder of the encasing operations is shown in FIG. 3, in which the same elements as in FIG. 2 carry the same references. In FIG. 3, the movement of rocking lever 42 about its spindle 43 in the direction of the arrows makes it possible to bring together jaws 32, 33 by the sliding of arms 40, 41 in sleeves 42, 43. The movement stops when surfaces 36 and 38 on the one hand and 34 and 39 on the other abut against one another. At this time, a capacitor 3 is disposed above the impression formed by the internal surfaces of the jaws. Moreover, a case 47 is placed beneath the jaws 32, 33 and the encasing operation is ready to start. This operation will now be described relative to FIGS. 4 to 6, which diagrammatically show a section along axis AA of FIG. 3 showing the successive stages of placing in the case. In these drawings, the same elements as in the preceding drawings carry the same references. In FIG. 4, the rotary table 30 is positioned in such a way that a case 47 is placed below the clamp formed by jaws 32,33. The form of the impressions 34, 35 of said jaws is made particularly clear. These identical impressions together form a cavity which, vertically and from top to bottom, successively has an inlet chamfer 40 for component 3 and then a parallelepiped cavity part 51, which has a rectangular shape when viewed in the vertical section of FIG. 4, said cavity part 51 having a width which is substantially equal to the width of the component 3 to be introduced. The cavity formed by jaws 32, 33 is then extended by a parallelepipedic cavity part 52 having a shape which is substantially identical to that of case 47. Parallelepipedic cavity part 52 is extended downwards by an inlet chamfer 53 of case 47. Table 30 is perforated on either side level with recess 48 for case 47. A piston 54 located beneath table 30, by an upwardly directed vertical translational movement, makes it possible to introduce case 47 between clamp jaws 32, 33 into recess 52 having a substantially identical size to that of case 47. This introduction is obviously facilitated by the inlet chamfer 53 permitting the guidance of the case between the jaws if the cavity part 52 and case 47 are not perfectly aligned. Following this operation of introducing the case between the jaws, capacitor 3 on belt 7 is in turn introduced between clamp jaws 32, 33 in a vertically downwards direction. Capacitor 3 is guided by the inlet chamfer 40 on the upper faces of the jaws and is then centred relative to case 47 located in cavity 52 by means of the parallelepipedic cavity 51 having the same width as the capacitor 3. Following these two operations of introducing the case between the jaws and the component into the case by means of the clamp, the stage shown in FIG. 5 is reached. As illustrated in FIG. 5, during this stage piston 54 is maintained beneath case 47, so as to keep the latter in position during the introduction of capacitor 3.

In FIG. 6, the clamp jaws 32, 33 are again spaced apart, which permits the translation of the support belt and the arrival of a further capacitor above the case, supplied during the displacement of the belt.

As shown in FIG. 7, the result of these operations is a capacitor 3 held in resin 47A within case 47.

What is claimed is:

1. A device for placing electronic components in cases, comprising:
    means for stepwise movement to an encasing station of electronic components having electrical connections supported by a belt;
    means for simultaneous stepwise movement to said enclosing station of electronic component cases mounted on a support;
    a clamp at said enclosing station, said clamp comprising two jaws movable into contact with one another, said jaws having contacting ends including mating recesses which together define a cavity extending in a first direction, said cavity having cross sections which sequentially correspond, as seen along said first direction, to a first chamfered opening forming a first funnel, to the shape of said case and to a second chamfered opening forming a second funnel;
    means for sequentially moving each of said electronic component cases along said first direction through said first funnel and into said cavity;
    means for sequentially moving each of said electronic components along said first direction through said second funnel and into one of said cases in said cavity; and means for opening said jaws to release said electrical component in said case.

2. A device for placing electronic components in cases according to claim 1, wherein said recess of each of said two jaws is identical.

3. A device according to claim 1, wherein said means for opening said jaws includes a single rotatably mounted rocking lever which, by a rotational movement, imparts to said jaws movements in opposite directions.

4. A device according to claim 1, wherein the moving support of the cases comprises a circular table provided with table recess in which are located said cases.

5. A device according to claim 4, wherein said means for moving said cases along said first direction comprise a piston located beneath said circular table and a corresponding opening in said circular table.

6. A device according to claim 5, including means for raising said piston through said circular table and retaining said piston at said clamp during insertion of said electronic component, whereby said piston supports said cases during said insertion of said components.

7. A device according to claim 1, including means for introducing hardenable liquid resin into said cases before positioning said cases in said jaws.

8. A process for placing electronic components in cases, comprising:
welding electronic components to electrical connections mounted on a movable belt;
sequentially positioning said components and connections above a clamp formed by two relatively movable jaws which together define a cavity having first and second funnel shaped openings;
filling cases with liquid resin;
sequentially positioning each of said cases under said clamp;
sequentially inserting each of said cases through said first funnel shaped opening and into said cavity;
sequentially inserting each of said components through said second funnel shaped opening and into one of said cases in said cavity;
sequentially separating said jaws to release each said inserted component and case;
sequentially retracting said inserted component and case from between said opened jaws; and
advancing said belt.

9. A process according to claim 8 wherein said case insertion step is performed by raising a piston, which pushes one of said cases between the jaws.

10. A process according to claim 9, wherein the piston is maintained beneath said one of said cases during the introduction of the component into said cavity.

* * * * *